United States Patent
Moroz et al.

(10) Patent No.: US 10,516,725 B2
(45) Date of Patent: Dec. 24, 2019

(54) CHARACTERIZING TARGET MATERIAL PROPERTIES BASED ON PROPERTIES OF SIMILAR MATERIALS

(71) Applicant: SYNOPSYS, INC., Mountain View, CA (US)

(72) Inventors: Victor Moroz, Saratoga, CA (US); Stephen Lee Smith, Mountain View, CA (US); Yong-Seog Oh, Pleasanton, CA (US); Jie Liu, San Jose, CA (US); Michael C. Shaughnessy-Culver, Santa Clara, CA (US); Terry Sylvan Kam-Chiu Ma, Danville, CA (US)

(73) Assignee: SYNOPSYS, INC., Mountain View, CA (US)

( * ) Notice: Subject to any disclaimer, the term of this patent is extended or adjusted under 35 U.S.C. 154(b) by 908 days.

(21) Appl. No.: 14/497,695

(22) Filed: Sep. 26, 2014

(65) Prior Publication Data

US 2015/0088803 A1 Mar. 26, 2015

Related U.S. Application Data

(60) Provisional application No. 61/883,158, filed on Sep. 26, 2013, provisional application No. 61/883,942, (Continued)

(51) Int. Cl.
*G06F 17/10* (2006.01)
*H04L 29/08* (2006.01)
*G06F 17/50* (2006.01)

(52) U.S. Cl.
CPC .......... *H04L 67/10* (2013.01); *G06F 17/5045* (2013.01)

(58) Field of Classification Search
CPC .............................. G06F 17/5045; H04L 67/10
(Continued)

(56) References Cited

U.S. PATENT DOCUMENTS

| 5,246,800 A | 9/1993 | Muray |
| 5,472,814 A | 12/1995 | Lin |

(Continued)

FOREIGN PATENT DOCUMENTS

| WO | 00-72185 A2 | 11/2000 |
| WO | 01-08028 A2 | 2/2001 |
| WO | 02-058158 A2 | 7/2002 |

OTHER PUBLICATIONS

Clark (Quantum Mechanics: Density Functional Theory and Practical Application to Alloy, 2010 (51 pages)).*

(Continued)

*Primary Examiner* — Andre Pierre Louis
(74) *Attorney, Agent, or Firm* — Haynes Beffel & Wolfeld LLP

(57) ABSTRACT

Roughly described, a technique for approximating a target property of a target material is provided. For each material in a plurality of anchor materials, a correspondence is provided between the value for a predetermined index property of the material and a value for the target property of the material, the values of all the index properties being different. A predictor function is identified in dependence upon the correspondence. A computer system determines a value for the target property for the target material in dependence upon the predictor function and a value for the index property for the target material. The determined value for the target property for the target material is reported to a user. The correspondence can be provided in a database on a non-transitory computer readable medium. The correspon- (Continued)

dence can be determined experimentally or analytically for each material in a plurality of anchor materials.

34 Claims, 8 Drawing Sheets

Related U.S. Application Data filed on Sep. 27, 2013, provisional application No. 61/889,444, filed on Oct. 10, 2013.

(58) Field of Classification Search
USPC .......................................................... 703/2
See application file for complete search history.

(56) References Cited

U.S. PATENT DOCUMENTS

| | | | |
|---|---|---|---|
| 5,702,847 A | 12/1997 | Tarumoto et al. | |
| 6,057,063 A | 5/2000 | Liebmann et al. | |
| 6,096,458 A | 8/2000 | Hibbs | |
| 6,685,772 B2 | 2/2004 | Goddard, III et al. | |
| 7,448,022 B1 | 11/2008 | Ram et al. | |
| 7,756,687 B2 | 7/2010 | Hwang et al. | |
| 8,112,231 B2 | 2/2012 | Samukawa | |
| 8,434,084 B2 | 4/2013 | Ferdous et al. | |
| 8,453,102 B1 | 5/2013 | Pack et al. | |
| 8,454,748 B2 | 6/2013 | Iwaki et al. | |
| 8,555,281 B1 | 10/2013 | van Dijk et al. | |
| 8,572,523 B2 | 10/2013 | Tuncer et al. | |
| 8,626,480 B2 | 1/2014 | Chang et al. | |
| 8,871,670 B2 | 10/2014 | Seebauer | |
| 9,727,675 B2 | 8/2017 | Liu et al. | |
| 9,922,164 B2 | 3/2018 | Chennamsetty et al. | |
| 9,983,979 B1 | 5/2018 | Dolinsky et al. | |
| 2002/0142495 A1* | 10/2002 | Usujima | G06F 17/5018 438/14 |
| 2003/0217341 A1 | 11/2003 | Rajsuman et al. | |
| 2003/0217343 A1 | 11/2003 | Rajsuman et al. | |
| 2004/0063225 A1 | 4/2004 | Borden et al. | |
| 2004/0067355 A1 | 4/2004 | Yadav et al. | |
| 2004/0107056 A1 | 6/2004 | Doerksen et al. | |
| 2005/0170379 A1* | 8/2005 | Kita | G01N 33/6803 435/6.18 |
| 2005/0223633 A1 | 10/2005 | Sankaranarayanan | |
| 2005/0278124 A1* | 12/2005 | Duffy | G01N 33/6803 702/19 |
| 2005/0281086 A1 | 12/2005 | Kobayashi et al. | |
| 2006/0038171 A1 | 2/2006 | Hasumi et al. | |
| 2006/0101378 A1 | 5/2006 | Kennedy et al. | |
| 2006/0271301 A1 | 11/2006 | Takada et al. | |
| 2007/0177437 A1 | 8/2007 | Guo | |
| 2007/0185695 A1 | 8/2007 | Neumann | |
| 2007/0265725 A1 | 11/2007 | Liu et al. | |
| 2008/0052646 A1 | 2/2008 | Tuncer et al. | |
| 2008/0147360 A1 | 6/2008 | Fejes et al. | |
| 2009/0032910 A1 | 2/2009 | Ahn et al. | |
| 2010/0052180 A1 | 3/2010 | Hoang et al. | |
| 2010/0070938 A1 | 3/2010 | Wang et al. | |
| 2010/0318331 A1 | 12/2010 | Ritchie | |
| 2011/0131017 A1 | 6/2011 | Cheng et al. | |
| 2011/0161361 A1 | 6/2011 | Csanyi et al. | |
| 2011/0231804 A1 | 9/2011 | Liu et al. | |
| 2011/0246998 A1 | 10/2011 | Vaidya et al. | |
| 2011/0313741 A1 | 12/2011 | Langhoff | |
| 2011/0313748 A1 | 12/2011 | Li | |
| 2012/0228615 A1 | 9/2012 | Uochi | |
| 2012/0232685 A1 | 9/2012 | Wang et al. | |
| 2013/0139121 A1 | 5/2013 | Wu et al. | |
| 2014/0180645 A1 | 6/2014 | Lee et al. | |
| 2014/0251204 A1* | 9/2014 | Najmaei | C30B 25/04 117/95 |
| 2015/0088473 A1 | 3/2015 | Liu et al. | |
| 2015/0088481 A1 | 3/2015 | Liu et al. | |
| 2015/0089511 A1 | 3/2015 | Smith et al. | |
| 2015/0120259 A1 | 4/2015 | Klimeck et al. | |
| 2016/0171139 A1 | 6/2016 | Tago et al. | |
| 2016/0335381 A1 | 11/2016 | Liu et al. | |

OTHER PUBLICATIONS

Luisier, Mathieu, "Quantum Transport for Engineers Lecture 4: Wave Function (WF) formalism and electrostatics", Integrated Systems Laboratory, ETH Zurich (2012), 34 pages.

Kim, Kyoung-Youm and Lee, Byoungho, "Quantum transport modeling in anisotropic semiconductors using Wigner function formulation", Proceedings Conference on Optoelectronic and Microelectronic Materials and Devices, COMMAD 2000. (2000), pp. 4.

Arovas, Daniel "Lecture Notes on Condensed Matter Physics, Chapter 1 Boltzmann Transport", Department of Physics, University of California, San Diego (2010), pp. 46.

Grau-Crespo, R. "Electronic structure and magnetic coupling in FeSbO4: A DFT study using hybrid functionals and GGA+U methods", Physical Review B 73, (2006), pp. 9.

Muramatsu, A., "Quantum Monte Carlo for lattice fermions", in: M.P. Nightingale, C.J. Umriga (Eds.), Proceedings of the NATO Advanced Study Institute on Quantum Monte Carlo Methods in Physics and Chemistry, Kluwer Academic Publishers, (1999), pp. 32.

Gross, E.K.U. and Maitra, N.T., "Introduction to TDDFT", Chapter in Fundamentals of Time-Dependent Density Functional Theory, Springer-Verlag (2012), 58 pages.

Marques, M.A.L. and Gross, E.K.U., "Time-dependent density functional theory," C. Fiolhais, F. Nogueira, M.A.L. Marques (Eds.), A Primer in Density Functional Theory, Springer Lecture Notes in Physics, vol. 620, Springer (2003), pp. 144-184.

Ryndyk, D.A., "Tight-binding model", Lectures 2006-2007, Dresden University of Technology, (2006-2007), pp. 26-30.

Bank, R.E., "Numerical Methods for Semiconductor Device Simulation", IEEE Transactions on Electron Devices, vol. ED-30, No. 9, (1983), pp. 1031-1041.

Lee, J.F., "Time-Domain Finite-Element Methods", IEEE Transactions on Antenna and Propagation, vol. 45, No. 3, (1997), pp. 430-442.

Eymard, R., "Finite Volume Methods", course at the University of Wroclaw, (2008), manuscript update of the preprint 'n0 97-19 du LATP, UMR 6632, Marseille, (Sep. 1997), Handbook of Numerical Anaylsis P.G. Ciarlet, J.L. Lions, eds. vol. 7, pp. 713-1020.

Chen, X.L., "An advanced 3D boundary element method for characterizations of composite materials", Engineering Analysis with Boundary Elements 29, (2005), pp. 513-523.

Marx, D., "Ab initio molecular dynamics: Theory and Implementation", Modern Methods and Algorithms of Quantum Chemistry, J. Grotendorst (Ed.), John von Neumann Institute for Computing, Julich, NIC Series, vol. 1, (2000), pp. 150.

Kresse, Georg, et al., "VASP the Guide",http://cms_mpi.univie.ac.atNASP, Sep. 9, 2013, Vienna, Austria, pp. 1-203.

PCT/US2014/057707—International Search Report and Wirtten Opinion dated Dec. 29, 2014, 16 pages.

PCT/US2014/057707—International Preliminary report on Patentability, 8 pages.

PCT/US2014/057637—International Preliminary Report on Patentability dated Mar. 29, 2016, 7 pages.

U.S. Appl. No. 14/906,543—Office Action dated Jun. 17, 2016, 26 pages.

PCT/US2014/057840—International Search Report dated Nov. 28, 2014, 9 pages.

U.S. Appl. No. 15/081,735—Office Action dated Jun. 15, 2016, 16 pages.

Saha et al., Technology CAD: Technology Modeling, Device Design and Simulation, 2004 VLSI Design Tutorial, Mubai, India, Jan. 5, 2004, 227 pages.

U.S. Appl. No. 14/497,681—Office Action dated Aug. 25, 2016, 20 pages.

Ayyadi et al., Semiconductor Simulations Using a Coupled Quantum Drift-Diffusion Schrodinger-Poisson Model, Aug. 12, 2004, Vienna University of Technology, pp. 1-19.

(56) References Cited

OTHER PUBLICATIONS

Kresse, G., et. al., VASP the Guide (Sep. 9, 2013), pp. 203.
U.S. Appl. No. 15/024,009—Final Office Action dated Nov. 18, 2016, 24 pages.
U.S. Appl. No. 15/081,735—Office Action dated Dec. 13, 2016, 30 pages.
PCT/US2014/057840—International Preliminary Report on Patentability dated Mar. 29, 2016, 5 pages.
U.S. Appl. No. 15/081,735—Response to Office Action dated Jun. 15, 2016 filed Nov. 15, 2016, 18 pages.
PCT/US2014/057803—International Search Report and Written Opinion dated Nov. 28, 2014, 14 pages.
U.S. Appl. No. 15/024,009—Office Action dated Jul. 21, 2016, 24 pages.
U.S. Appl. No. 15/024,009—Response to Office Action dated Jul. 21, 2016 filed Nov. 1, 2016, 38 pages.
U.S. Appl. No. 15/024,009—Preliminary Amendment filed Mar. 22, 2016, 9 pages.
Martin-Bragado et al., "Modeling charged defects, dopant diffusion and activation mechanisms for TCAD simulations using Kinetic Monte Carlos," Nuclear Instruments and Methods in Physics Research Section B: Beam Interactions with Materials and Atoms, 253:1, 18 pages, Dec. 2006.
Nagel, Laurence W., "SPICE2: A Computer Program to Simulate Semiconductor Circuits", Memorandum No. UCB/ERL-M520, Electronics Research Laboratory, College of Engineering, University of California, Berkeley, CA USA, (May 9, 1975), 431 pages.
Synopsys, Sentaurus TCAD, Industry-Standard Process and Device Simulators, Datasheet (2012), 4 pages.
Yip, S. (ed.), Handbook of Materials Modeling, 565-588. c 2005 Springer.
U.S. Appl. No. 14/497,681—Respponse to Office Action dated Aug. 25, 2016 filed Jan. 24, 2017, 10 pages.
U.S. Appl. No. 14/906,543—Response to Office Action dated Jun. 17, 2016 filed Dec. 19, 2016, 12 pages.
U.S. Appl. No. 14/906,543—Final Office Action dated Feb. 10, 2017, 16 pages.
U.S. Appl. No. 14/906,543—Preliminary Amendment dated Jan. 20, 2016, 8 pages.
U.S. Appl. No. 15/081,735—Response to Office Action dated Dec. 13, 2016, filed Mar. 13, 2017, 10 pages.
PCT/US2014/057637—International Search Report and Written Opinion dated Jan. 5, 2015, 12 pages.
Taur, Y., "CMOS design near the limit of scaling", IBM J. Res. & Dev., vol. 46, No. 2/3, Mar./May 2002, 10 pages.
Wang, Yan, "Multiscale Simulations", Georgia Institute of Technology, available at http://www-old.me.gatech.edu/~ywang/CANE/lect05_MultiscaleSims_yanwang.pdf, dated May 14-16, 2012, 40 pages.
Braunstein, Rubin, et al., "Intrinsic Optical Absorption in Germanium-Silicon Alloys", Physical Review, vol. 109, No. 3, Feb. 1, 1958, pp. 695-710.
Sant, Saurabh, et al., "Band gap bowing and band offsets in relaxed and strained Si1-xGex alloys by employing a new nonlinear interpolation scheme", published online Jan. 18, 2013, Journal of Applied Physics, vol. 113, pp. 033708-1 through 033708-10.
Kresse, Georg, et al., "VASP the Guide",http://cms.mpi.univie.ac.at/VASP, Sep. 9, 2013, Vienna, Austria, pp. 1-203.
Uppal, S., et al., "Diffusion of boron in germanium at 800-900° C", Journal of Applied Physics, Aug. 1, 2004, vol. 96, No. 3, pp. 1376-1380.
Haddara, Y.M., et al., "Accurate measurements of the intrinsic diffusivities of boron and phosphorus in silicon", Applied Physics Letters, Sep. 25, 2000, vol. 77, No. 13, pp. 1976-1978.
Uppal, S., et al., "Diffusion of ion-implanted boron in germanium", Journal of Applied Physics, Oct. 15, 2001, vol. 90, No. 8, p. 4293-4295.
Stadler, J., et al., "IMD: a Software Package for Molecular Dynamics Studies on Parallel Computers", International Journal of Modren Physics C, Oct. 1997, vol. 8, No. 5, pp. 1131-1140.
Refson, Keith, "Moldy: a portable molecular dynamics simulation program for serial and parallel computers", Computer Physics Communications, Apr. 11, 2000, vol. 126, issue 3, pp. 310-329.
Smith, W., et al., "DL_POLY: Application to molecular simulation", Molecular Simulation, May 5, 2002, vol. 28, Issue 5, pp. 385-471.
Smith, W., and T.R. Forester, "DL_POLY_2.0: A general-purpose parallel molecular dynamics simulation package", Journal of Molecular Graphics, Jun. 1996, vol. 14, Issue 3, pp. 136-141.
Nieminen, Risto M., "From atomistic simulation towards multiscale modelling of materials", J. Phys.: Condens. Matter, published Mar. 8, 2002, vol. 14, pp. 2859-2876.
"Simulation of Random Dopant Fluctuation Effects in TCAD Sentaurus", TCAD News, Dec. 2009, Synopsys, Mountain View, CA, USA, 4 pages.
Yu, P.Y., and M. Cardona, "2. Electronic Band Structures", Fundamentals of Seminconductors, Graduate Texts in Physics, 4th ed., Springer-Verlag Berlin Heidelberg, 2010, pp. 17-106.
"ITRS, International Technology Roadmap for Semiconductors, 2012 Update", (2012), available at http://www.itrs.net/Links/2012ITRS/2012Chapters/2012Overview.pdf, 76 pages.
"Sentaurus TCAD" datasheet, Synopsys, Inc., Mountain View, CA USA, May 2012, 4 pages.
"ITRS, 2012 Overall Roadmap Technology Characteristics (ORTC) Tables", International Technology Roadmap for Semiconductors, 2012, availalbe at http://www.itrs.net/Links/2012ITRS/2012Tables/ORTC_2012Tables.xlsm, visited Oct. 14, 2013, 39 pages.
Hansen, Stephen E., "SUPREM-III User's Manual, Version 8628", Aug. 1986, available from http://www-tcad.stanford.edu/tcad/programs/suprem3man.pdf, visited Oct. 14, 2013, 186 pages.
"Sentaurus Device" datasheet, Synopsys, Inc., Mountain View, CA, USA, Feb. 2007, 8 pages.
Martin-Bragado, Ignacio, et al., "Modeling charged defects, dopant diffusion and activation mechanisms for TCAD simulations using Kinetic Monte Carlo", Nuclear Instruments and Methods in Physics Research Sectin B: Beam Interactions with Materials and Atoms, 253:1, pp. 63-67, 2006, 18 pages.
Dunham, Scott T., "A Quantitative Model for the Coupled Diffusion of Phosphorus and Point Defects in Silicon", J. Electrochem. Soc., vol. 139, No. 9, Sep. 1992, pp. 2628-2636.
Skinner, Richard D., editor, "Basic Integrated Circuit Manufacturing", section 2 of "Technology Reference Manual", ICE, Integrated Circuit Engineering, 1993, 112 pages.
Nagel, L.W., and D.O. Pederson, "Spice (Simulation Program with Integrated Circuit Emphasis)", Memorandum No. ERL-M382, Electronics Research Laboratory, College of engineering, University of California, Berkeley, CA USA, Apr. 12, 1973, 65 pages.
Quarles, Thomas Linwood, "Analysis of Performance and Convergence Issues for Circuit Simulation", Memorandum No. UCB/ERL M89142, Electronics Research Laboratory, College of Engineering, University of California, Berkeley, CA USA, Apr. 1989, 142 pages.
Dunga, Mohan V., et al., "BSIM4.6.0 MOSFET Model—User's Manual", Department of Electrical Engineering and Computer Sciences, University of California, Berkeley, CA USA, 2006, 201 pages.
Burke, Kieron, and friends, "The ABC of DFT", available at http://chem.ps.uci.edu/~kieron/dft/book/, Apr. 10, 2007, 104 pages.
Luisier, Mathieu, "Quantum Transport Beyond the Effective Mass Approximation", Diss. ETH No. 17016, 2007, 150 pages.
Côté, Michel, "Introduction to DFT+U", International Summer School on Numerical Methods for Correlated Systems in Condensed Matter, Universite de Montreal, (2008), pp. 23.
Lee et al., "Area and Volume Measurements of Objects with Irregular Shapes Using Multiple Silhouettes," Optical Engineering 45(2), Feb. 2006, 11 pages.
Keneti, et al., "Determination of Volume and Centroid of Irregular Blocks by a Simplex Integration Approach for Use in Discontinuous Numerical Methods," Geomechanics and Geoengineering: An International Journal, vol. 3, No. 1, Mar. 2008, pp. 79-84.
U.S. Appl. No. 15/081,735—Notice of Allowance dated Mar. 29, 2017, 17 pages.
U.S. Appl. No. 14/497,681—Final Office Action dated May 3, 2017, 28 pages.

(56) References Cited

OTHER PUBLICATIONS

Isik, A., "Molecular Dynamics Simulation of Silicon Using Empirical Tight-Binding Method," Massachusetts Institute of Technology, Jan. 1992, 89 pages.
Miloszewski, J., "Simulations of Semiconductor Laser Using Nonequilibrium Green's Functions Method," University of Waterloo, 2012, 129 pages.
U.S. Appl. No. 15/024,009—Response to Final Office Action dated Nov. 18, 2016 filed Mar. 20, 2017, 24 pages.
Jegert, et al. "Role of Defect Relaxation for Trap-Assisted Tunneling in High-k Thin Films: A First-Principles Kinetic Monte Carlo Study" Physical Review B 85.4 (2012), 8 pages.
U.S. Appl. No. 14/498,492—Notice of Allowance dated Aug. 14, 2017, 28 pages.
Clark, "Quantum Mechanics: Density Functional Theory and Practical Application to Alloys." Introduction to Compter Simulation (2010), 51 pages.
U.S. Appl. No. 14/906,543—Response to Final Office Action dated Feb. 10, 2017 filed Jun. 23, 2017, 15 pages.
U.S. Appl. No. 14/906,543—Advisory Action dated Aug. 2, 2017, 4 pages.
U.S. Appl. No. 14/498,458—Notice of Allowance dated Sep. 7, 2017, 29 pages.
U.S. Appl. No. 15/669,722—Office Action dated Oct. 6, 2017, 30 pages.
U.S. Appl. No. 14/497,681—Response to Final Office Action dated May 3, 2017 filed Nov. 3, 2017, 13 pages.
U.S. Appl. No. 14/497,681—Office Action dated Dec. 20, 2017, 25 pages.
U.S. Appl. No. 15/669,722—Notice of Allowance dated Mar. 7, 2018, 5 pages.
U.S. Appl. No. 15/669,722—Response to Office Action dated Oct. 6, 2017 filed Jan. 10, 2018, 3 pages.
U.S. Appl. No. 14/497,681—Response to Office Action dated Dec. 20, 2017 filed Mar. 20, 2018, 11 pages.
U.S. Appl. No. 15/021,655—Office Action dated Apr. 19, 2018, 43 pages.
U.S. Appl. No. 14/497,681—Final Office Action dated May 11, 2018, 19 pages.
U.S. Appl. No. 14/497,681—Advisory Action dated Aug. 3, 2018, 7 pages.
Taylor et al., "Ab initio modeling of quantum transport properties of molecular electronic devices", 2001, Physical Review B 63.24, 245407, pp. 1-13.
Sverdlov et al., "Current Transport Models for Nanoscale Semiconductor Devices," 2008, Materials Science and Engineering: R: Reports 58.6, pp. 228-270.
U.S. Appl. No. 15/224,165—Office Action dated Aug. 7, 2018, 47 pages.
U.S. Appl. No. 14/497,681—Office Action dated Sep. 5, 2018, 22 pages.
U.S. Appl. No. 15/021,655—Notice of Allowance dated Nov. 7, 2018, 13 pages.
U.S. Appl. No. 15/021,655—Response to Office Action dated Apr. 19, 2018 filed Jul. 18, 2018, 17 pages.
U.S. Appl. No. 15/224,165—Response to Office Action dated Aug. 7, 2018 filed Dec. 4, 2018, 14 pages.
U.S. Appl. No. 14/497,681—Response to Final Office Action dated May 11, 2018 filed Jul. 13, 2018, 12 pages.
U.S. Appl. No. 14/497,681—Response to Office Action dated Sep. 5, 2018 filed Dec. 5, 2018, 11 pages.
U.S. Appl. No. 14/497,681—Final Office Action dated Feb. 7, 2019, 23 pages.
U.S. Appl. No. 15/224,165—Final Office Action dated Feb. 6, 2019, 14 pages.
PCT/US2014/057803—International Preliminary Report on Patentability dated Mar. 29, 2016, 10 pages.
U.S. Appl. No. 14/497,681—Response to Final Office Action dated Feb. 7, 2019, as filed Jun. 6, 2019, 9 pages.
Capelle, "A Bird's-Eye View of Density-Functional Theory", Departamento de Fisica e Informatica Instituto de Fisica de Sao Carlos, Universidade de Sao Paulo, Caixa Postal 369, Sao Carlos, 13560-970 SP, Brazil, arXiv:cond-mat/0211443v5 [cond-mat.mtrl-sci], Nov. 18, 2006, pp. 1-69.
U.S. Appl. No. 15/021,655—Notice of Allowance dated May 1, 2019, 12 pages.
U.S. Appl. No. 15/224,165—Response to Final Office Action dated Feb. 6, 2019 filed Jun. 13, 2019, 13 pages.
U.S. Appl. No. 15/224,165—Advisory Action dated Jun. 27, 2019, 4 pages.
U.S. Appl. No. 14/497,681—Notice of Allowance dated Jul. 25, 2019, 22 pages.
U.S. Appl. No. 15/861,605—Office Action dated Aug. 2, 2019, 32 pages.

* cited by examiner

CHARACTERIZING TARGET MATERIAL PROPERTIES BASED ON PROPERTIES OF SIMILAR MATERIALS

REFERENCE TO RELATED APPLICATIONS

This application claims benefit of U.S. Provisional Patent Application No. 61/883,158 filed on Sep. 26, 2013, U.S. Provisional Patent Application No. 61/883,942 filed on Sep. 27, 2013, and U.S. Provisional Patent Application No. 61/889,444 filed on Oct. 10, 2013. Those provisional patent applications are incorporated by reference as if fully set forth herein.

BACKGROUND

This invention relates to methods for evaluating candidate materials for fabrication of integrated circuits in computer aided design (CAD) and electronic design automation (EDA) systems.

DESCRIPTION OF RELATED ART

The semiconductor industry has been steadily widening the number of materials that are used to manufacture the integrated circuits. The transition from planar transistors to FinFETs is further accelerating and widening the search. There are several different classes of materials of interest with very different desirable properties. For example, material for the transistor's channel should satisfy the following criteria:

Provide high carrier mobility
Provide consistent behavior from one transistor to the next, with small random variability
Provide large enough bandgap to prevent band-to-band tunneling off-state leakage
Provide small enough bandgap with high Density Of States (DOS) to ensure large number of carriers in the channel for the on-state biasing conditions
Provide low enough effective carrier mass to ensure high on-state current
Provide high enough effective carrier mass to ensure low off-state current due to the direct source-to-drain tunneling
Provide crystal lattice size that is compatible with the adjacent materials and enables stress engineering
Provide high enough mechanical strength to prevent dislocations and cracking
Provide low enough mechanical strength to enable straining the channel by the adjacent materials for stress engineering
Provide the ability to introduce dopants to control the conductivity and threshold voltage
The dopants should have shallow enough energy levels in the bandgap to prevent incomplete ionization at low temperatures
Provide low enough defect density to avoid excessive carrier recombination that degrades the transistor performance
Provide high enough defect density to quickly remove unintentional carriers generated by radiation (i.e. Single Event Upset (SEU)) or cross-talk with the adjacent transistors or Electro-Static Discharge (ESD)
Provide low enough density of dangling bonds at the interface with the gate dielectric to reduce carrier scattering and carrier trapping that degrade transistor performance
Provide sufficient bonding strength to the gate dielectric to prevent delamination
Provide consistent layer/film/wire size from one transistor to the next to ensure reproducible transistor behavior
Provide low enough interface roughness with the gate dielectric to reduce carrier surface scattering in narrow layers/films/wires and therefore high conductance
Provide workfunction that is compatible with the other key materials in the transistor: high enough barrier to the gate dielectric, within the range of gate workfunction to set desired threshold voltages, and low enough barrier to the source and drain materials
Provide breakdown voltage that is at least 20% higher than the highest power supply voltage on the chip, which is usually 2.5 V for the input/output circuit
Cost effective material mining
Cost effective material synthesis/deposition
Available in sufficient quantities
Not toxic and environment friendly
Stable mechanically and chemically within the desired temperature range and ambient conditions to prevent degradation of transistor behavior over time
Provide the ability to be etched with acceptable chemistry and timeframe for patterning blanket films into transistors
Provide the ability to be selectively grown/deposited on top of the patterned wafer
Provide the thermal stability that is compatible with the other materials on the same wafer, including channel materials for the n-type and p-type transistors in the Front End Of Line process (FEOL), and including the interconnects in the Back End Of Line process (BEOL)
Provide comparable performance to the other type of transistor on the same chip (e.g. the performances of n-type and p-type transistors should be comparable for efficient circuit design)
Provide thermal properties that enable sufficient removal of the Joule heat generated during transistor operation
Beat silicon and other competing candidates in terms of on-state performance, off-state leakage, scalability for the target technology nodes, manufacturing yield, reliability during the target transistor lifetime and environment conditions, material cost, and manufacturing cost This incomplete list illustrates how difficult it is to find new materials, yet finding them can offer a tremendous advantage in the marketplace with a potential to dominate it.

A popular way to evaluate new materials is through the first-principles analysis such as Density Functional Theory (DFT). The DFT enables evaluation of some of the key properties from the list above, but is extremely computationally intensive, and therefore takes a long time and a large effort to accomplish. It is highly desirable to come up with some short cuts to speed up screening of potential materials.

SUMMARY

According to the invention, roughly described, target material properties can be evaluated based on the properties of similar materials. For example, we are given properties of the alloy with two different compositions that we will refer to as materials A and B, and interested in an alloy with the third composition that we will refer to as material C. The conventional approach would be to run the time-consuming DFT analysis for the promising material C. We instead evaluate material C based on materials A and B without performing the expensive DFT analysis. It is known that simple linear interpolation or extrapolation of the A and B properties works in some cases but often fails and therefore is unreliable. Therefore, in one embodiment we use an approach that takes into account all major sub-bands of the band structure that makes it safe to navigate unknown material compositions within certain limits. This approach can be applied to pure crystalline materials as well as to binary, ternary, and quaternary alloys and even to amorphous materials.

In an embodiment, this approach can be used to perform Stoichiometric search and optimization of materials. For instance, to optimize a kind of material $A\_x B\_y C\_z$ (not limited to ternary) with three elements A, B, and C, and ratio x:y:z, the material properties as functions of x, y, and z can be interpolated and/or extrapolated. Similar techniques can be used for example on the search and optimization of the dopant concentration and the material composition. The proposed approach can help reducing the amount of experimental effort needed to search and optimize the target material properties. So it can significantly reduce the development cost and time.

DETAILED DESCRIPTION

Figure 1:
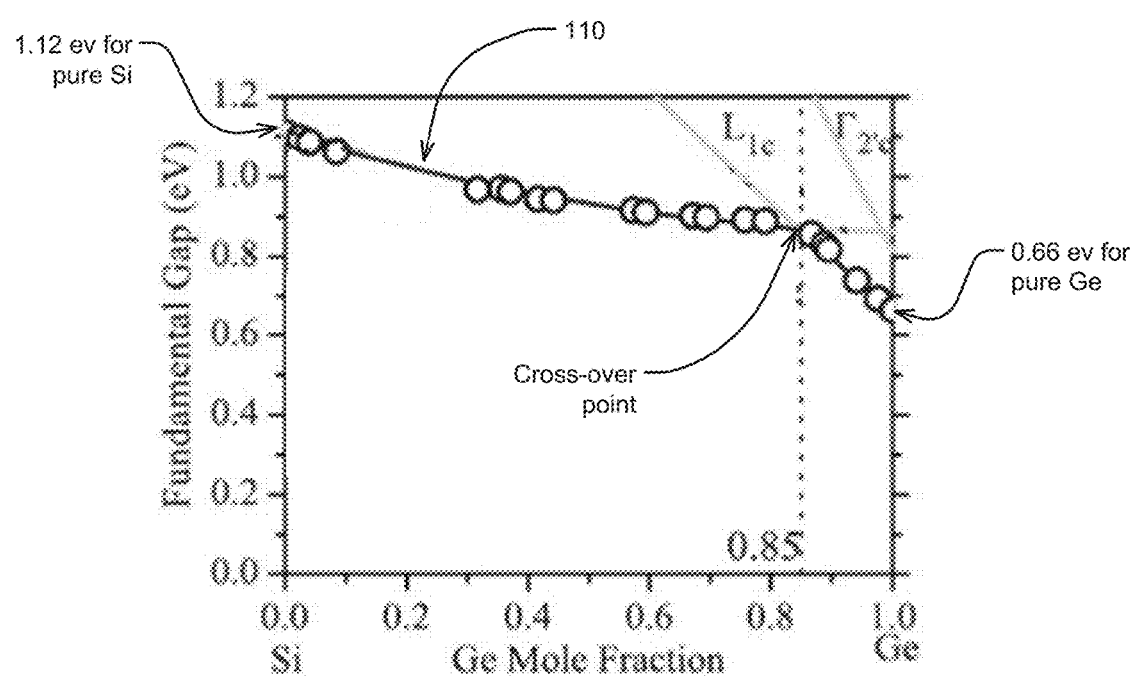
FIG. 1 illustrates the SiGe bandgap behavior as a function of SiGe composition.

Consider SiGe alloy. The bandgap of pure Si is 1.12 eV at room temperature, and the bandgap of pure Ge is 0.66 eV at room temperature. The bandgap of the SiGe alloy exhibits complex non-linear behavior, illustrated on FIG. 1. FIG. 1 illustrates the SiGe bandgap as a function of SiGe composition, from S. Sant et al., J. Appl. Phys., v. 113, pp. 033708-1 through 033708-10 (2013), incorporated by reference herein.

This non-linear behavior is caused by the sub-bands of the SiGe bandstructure. For pure silicon, most of the electrons in the conduction band are populating the delta valleys as the most energetically favorable. In pure Ge, most of the electrons in conduction band occupy the lambda valleys, which have the lowest energy there. The cross-over point between the delta and lambda valley dominance happens at 85% Ge fraction.

This non-linear behavior can be described not only by the computationally expensive DFT model, but also by considerably faster methods like Empirical Pseudo-potential Method (EPM). The EPM can be used to quickly evaluate the bandgap of arbitrary SiGe composition without loss of accuracy.

Similarly, other computationally efficient approaches can be employed to evaluate other particular properties of the alloys. A combination of the computationally efficient methods enables accurate evaluation of the arbitrary materials based on a few compositions that are fully characterized by DFT.

In the case of SiGe, we have already mentioned the bandgap. Here are several other parameters of interest that can be estimated from knowledge of A and B without direct DFT calculations in C.

These parameters include:
1. Lattice constant. This is the equilibrium separation between atoms. In this case a linear interpolation may be enough, but a more sophisticated one based on the behavior of some other parameters (such as bandgap) may also be appropriate. Using bandgap, for example, once the form of the interpolation of the band gap as a function of the mole fraction, x, is determined, this same form can be used to determine the lattice constant. If bandgap of A ($bg_A$) and bandgap of B are known and the interpolation function for bandgap of C, $bg_C(x, bg_A, bg_B)$ is decided, then the lattice constant of C, $lc_C(x, lc_A, lc_B)$, can be estimated by making the replacements: $lc_A \to bg_A$, $lc_B \to bg_B$, $lc_C \to bg_C$.
2. Local magnetic moment. In this case the magnetization of a particular atom can be calculated in DFT at some value of the interpolation index, x. For example consider an alloy of Si and Mn, $Si_{1-x}Mn_x$. For small x, the magnetization of the Mn atoms will be about $5\mu_B$. As x increases the Mn atoms magnetization will decrease due to their antiferromagnetic interaction. Using a high concentration model as material B and the low concentration model as material A, the magnetizations on atoms in materials C with intermediate concentrations can be interpolated.
3. Defect formation energy. The formation energy of a particular defect can be calculated for the same type of defect in materials A and B. An example would be a vacancy in the SiGe alloy. Then the interpolation scheme can be used to arrive at a defect formation energy for an intermediate value of the interpolation index.
4. In the case of a crystalline material and an amorphous material, the degree of disorder in the structure can be used as the interpolation index, x, in the same way the mole fraction is used in the bandgap or lattice constant interpolations. A fully crystalline material, A, and a completely disordered material, B, with the same composition would have x=0 and x=1, respectively. Then any partially disordered material with the same composition can have x between 0 and 1, depending on the degree of disorder.
5. An extension of the method is to do detailed DFT calculations for several values of the interpolation index, x, between 0 and 1. Then, for intermediate values of x not calculated, the above subband (SiGe example), matching (point 1.), linear, polynomial, or other curve-fit interpolation schemes can be used between the values of x at which the DFT calculations are carried out. In this way the accuracy of the interpolation can be increased while doing only a few more calculations.

In general, aspects of the invention can be used to predict the value of a target property Pt, in a target material Mt under investigation. The prediction is based on known values of the target property for each of two or more "anchor" materials Ma1, Ma2, . . . . Embodiments need not be limited to only two anchor materials A and B. For the particular target property and anchor materials, a predictor function is determined which relates the value of the target property to an index property. The value of the index property is known for each of the anchor materials as well as for the target material, but the value of the target property is known for only the anchor properties; the unknown is the value of the target property for the target material.

In an example, the target material may be $Si_{(1-x)}Ge_x$, where x=0.7, and it is desired to predict its fundamental gap energy. Thus the target property is fundamental gap energy. A function that relates fundamental gap energy to x is known, as illustrated in FIG. 1. Thus the curve (e.g. 110) plotted in FIG. 1 can be the predictor function, and the index property can be Ge mole fraction x. Two anchor materials may be used, which are pure Si crystal and pure Ge crystal, because both the value of the index property (x) and the value of the target property (fundamental gap energy) are known for both of such materials. The value of the index property x is known also for the target material $Si_{(1-x)}Ge_x$ (x=0.7). All that remains, therefore, is to evaluate the predictor function at x=0.7 to predict the value of the target property, fundamental gap energy, of the target material. This can be accomplished arithmetically or by drawing lines on the plot of FIG. 1. As shown in the example of FIG. 1, for x=0.7, the target property of the target material is fundamental gap energy at about 0.9 eV. The curve in FIG. 1 (e.g. 110), that represents results of the predictor function for the material $Si_{(1-x)}Ge_x$ over the SiGe composition range, is shown in agreement with the experimental data values.

The experimental data values were determined by preparing experimental samples of SiGe alloys over a composition range between pure Si and pure Ge inclusively, measuring intrinsic optical absorption spectrum of the experimental samples as a function of the SiGe alloy composition, and deriving energy gaps as a function of the SiGe alloy composition from the measurements. The composition dependence of the derived energy gap shows an abrupt change in slope at about 15 atomic percent Si or 85 atomic percent Ge.

Note that in some embodiments, more than one number may be needed to properly index the anchor materials. For example, when evaluating an alloy of three materials X, Y and Z, the anchor materials might differ not only in the mole ratio of Y:X, but also in the mole ratio of Z:X. In this case the "index value" might include two components: the mole ratio of Y:X, but also in the mole ratio of Z:X, or an equivalent. Thus as used herein, the index property "value" can be a scalar or a vector having more than one "component".

Figure 2:
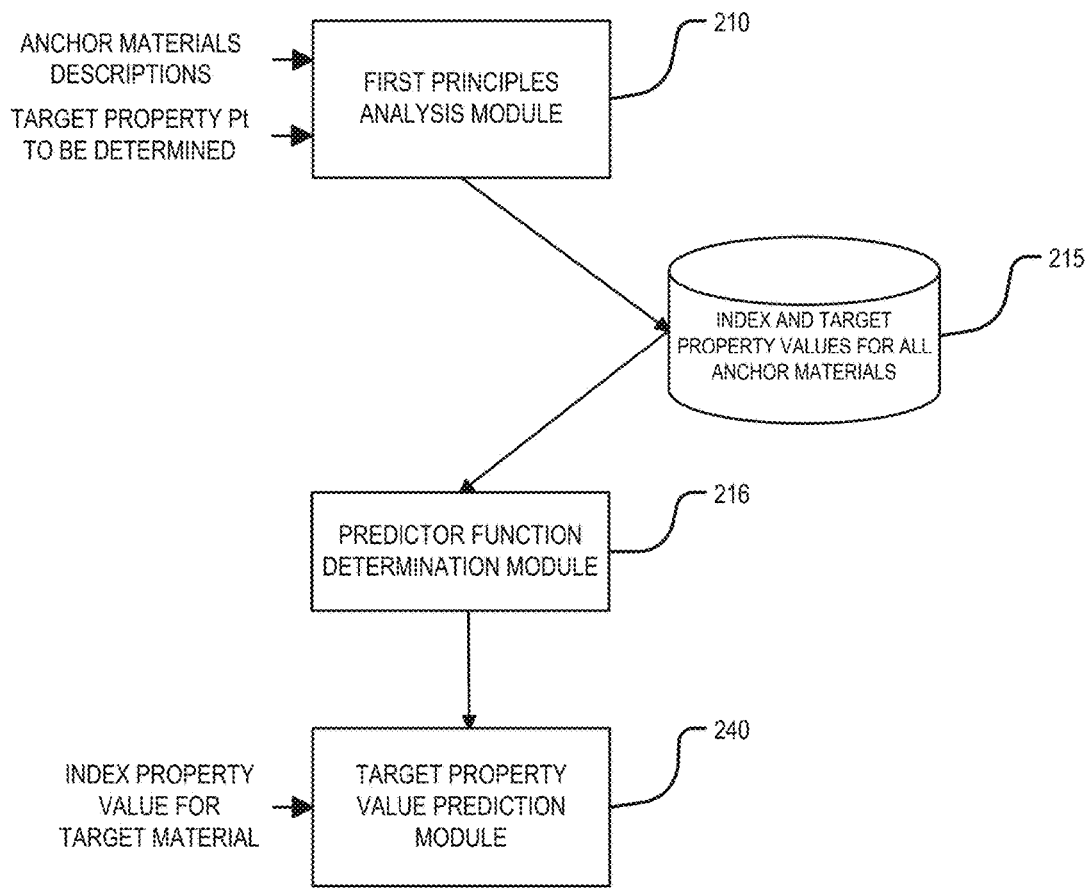
FIG. 2 is a flow chart illustrating an overall methodology of an embodiment.

FIG. 2 is a flow chart illustrating an overall methodology of an embodiment. First Principles Analysis module 210 is a module that can provide, among other things, total energy calculations required to parameterize diffusion models. Some atomistic simulation methods, particularly density functional theory (DFT) calculations, are commonly referred to as ab initio or first principles tools because they require minimal empirical input to generate accurate ground state total energies for arbitrary configurations of atoms. These tools make use of the most fundamental governing quantum mechanical equations, and require very little in the way of externally-supplied materials parameters. This capability makes these methods well-suited to investigating new materials and to providing highly detailed physical insight into materials properties and processes. As used herein, an "ab initio" or "first principles" analysis module is a module that develops its results at least in part by solving Schrödinger's equation based on positions and types of atoms. Other example first principles tools that can be used in module 210 include EPM (Empirical Pseudo-potential Method) tools, and ETB (Empirical Tight Binding) tools, and combinations of tools.

The first principles analysis module 210 takes as inputs anchor materials descriptions and target property Pt to be determined. The target property Pt to be determined can include fundamental gap energy, and the diffusivity of Boron dB. Other example target properties may be crystal lattice constant, local magnetic moment, or defect formation energy. The anchor materials descriptions are described in connection with FIG. 3.

In one embodiment, for each material in a plurality of anchor materials, a correspondence is provided between the value for a predetermined index property of the material and a value for the target property of the material, where the values of all the index properties are different. The correspondences between the value for a predetermined index property of the material and the value for the target property for the various anchor materials is computed analytically rather than experimentally.

In one example two anchor materials are chosen, pure crystalline Si and pure crystalline Ge. The value of the target property dB is known for both anchor materials ($1.2 \cdot 10^{-16}$ $cm^2/s$ for Si, and $1.5 \cdot 10^{-16}$ $cm^2/s$ for Ge at 850° C.), the value for the index property x is known for both anchor materials (0.0 for Si and 1.0 for Ge), and the value of the index property x is also known for the target material (0.7). In another example, the target material is partially amorphous, the anchors can be the corresponding purely crystalline and purely amorphous versions, and the index property may be one that indicates degree of disorder.

The system of FIG. 2 involves a database 215 that relates the index property value and the target property Pt value for each of a number of anchor materials $M_{a1}, \ldots, M_{aN}$ (N>1). In one embodiment, the value of the target property Pt is known for all the anchor materials, and the value of the index property is also known for all the anchor materials. In another embodiment, the value of the target property Pt is determined experimentally for all the anchor materials. This is the situation in the embodiment of FIG. 1. In yet another embodiment, the system of FIG. 2 calculates the target property values (and, in some embodiments the index property values as well) for the plurality of anchor materials. Preferably a First Principles Analysis Module 210 is used for this purpose.

As used herein, no distinction is intended between whether a database is disposed "on" or "in" a computer readable medium. Additionally, as used herein, the term "database" does not necessarily imply any unity of structure. For example, two or more separate databases, when considered together, still constitute a "database" as that term is used herein. Thus in FIG. 2, the database 215 can be a combination of two or more separate databases.

In module 216, a predictor function is determined which relates the value of target property with the value of the index property. This determination can be made in a number of ways. In one example, it can be made by reference to the existing literature. In another example, it can be made experimentally. In another example, it can be made by reference to certain principles of physics (as might be the case for target properties such as diffusivity of Boron, or the band gap energy). In one embodiment, the predictor function is an empirically derived function, such as a polynomial, which has been curve-fit from experimental data taken on three or more anchor materials. The determination typically is made in dependence upon the known values of the target property and index property for all the anchor materials. Note that the predictor function need not be smooth or continuous.

As used herein, a given function or value is "in dependence upon" a known value if the known value influenced the given function or value. If there is an intervening processing element, step or time period, the given event can still be "in dependence upon" the known value. If the intervening processing element or step combines more than one known value, the output of the processing element or step is considered "in dependence upon" each of the known value inputs. For instance, the given function can be the predictor function, which module 216 determines in dependence upon the correspondences in database 215.

In the example of Boron diffusivity in $Si_{(1-x)}Ge_x$, it is known that at small x, Boron diffuses primarily via the Si interstitials, and that the diffusivity via this mechanism diminishes as x increases. It is also known that at larger x, Boron diffuses primarily via crystalline vacancies, and that the diffusivity via this mechanism diminishes as x decreases. It is known further that the diffusivity of Boron at any given value of x is roughly the sum of the diffusivity by these two mechanisms, and that the resulting function has a bathtub-like shape. Thus knowing these physics principles, and knowing the value of the target property (dB) in both of the anchor materials Si and Ge, the predictor function can be determined.

The predictor function determination module 216 can be either in the First Principles Analysis Module 210, or in Target Value Prediction module 240, or separate from both. In one embodiment it may be performed by a computer using fitting algorithms, but in another embodiment a human can provide input in the form of theoretical or expert knowledge. Such knowledge may be used for example to define the form of the predictor function, with the computer system calculating coefficients of the function needed to best fit it to the index and target property values in database 215.

For instance, for an empirical pseudopotential method (EPM), a predictor function can represent a nonlinear interpolation method by empirical expressions using a spline interpolation scheme or a polynomial interpolation scheme. Basic expression in both schemes is similar and is given by:

$$V_{alloy}(r) = (1-x)\frac{\Omega_{Si}}{\Omega_{alloy}}V_{Si}(r) + x\frac{\Omega_{Ge}}{\Omega_{alloy}}V_{Ge}(r) - $$
$$p(x \text{ or } q)[x(1-x)]\left[\frac{\Omega_{Ge}}{\Omega_{alloy}}V_{Ge}(r) - \frac{\Omega_{Si}}{\Omega_{alloy}}V_{Si}(r)\right]$$

from S. Sant et al., J. Appl. Phys., v. 113, page 033708-3, where r is reciprocal lattice vectors, q is the same as r, $V_{Si}$, $V_{Ge}$ and $V_{alloy}$ are the local pseudopotentials of Si, Ge, and $Si_{(1-x)}Ge_x$ alloys, and $\Omega_{Si}$, $\Omega_{Ge}$, and $\Omega_{alloy}$ denote the respective volume of a unit cell in Si, Ge, and $Si_{(1-x)}Ge_x$. The Fourier transform of the equation is used in actual calculations. The nonlinear interpolation coefficient p is a function of the reciprocal lattice vector (p(q)) or Ge mole fraction (p(x)) in the spline interpolation scheme and polynomial interpolation scheme, respectively.

For the spline interpolation scheme, values of p(|q|) at the reciprocal lattice vector are treated as parameters which can be calibrated to the experimental bandgap of SiGe. Once the parameter values are determined, p(|q|) for any arbitrary q can be calculated by using spline interpolation between the determined parameter values.

For the polynomial interpolation scheme, the nonlinear interpolation coefficient p is a polynomial of sixth degree in x (Ge mole fraction):

$$p(x)=b_0+b_1x+b_2x^2+ \ldots +b_6x^6$$

from S. Sant et al., J. Appl. Phys., v. 113, page 033708-3. Coefficients of the polynomial (e.g. $b_0 \ldots b_6$) are treated as parameters, and can be calibrated to the experimental bandgap of SiGe.

Now that a predictor function is available, the value for the target property for the target material can be determined simply by evaluating the predictor function using the value for the index property for the target material, by the target value prediction module 240.

In analysis module 210 (FIG. 2), if a first principles analysis is being used to determine target property values of anchor materials, a problem may arise if the target property value differs for different possible physical states of the anchor material, which states are not distinguished by the index property. For example, in an alloy such as SiGe, where the index property to be used is the Ge mole fraction, any individual cell of the lattice structure may have any of several possible lattice configurations, and these lattice configurations are not distinguished by the index property. On the other hand, certain first principles analysis tools (such as DFT) calculate property values only for a specific lattice configuration. An issue therefore arises because what is desired is a single value for the target property for any SiGe alloy having a specified index value, not a separate target property value for each lattice configuration of a SiGe alloy having the specified index value.

Figure 3:
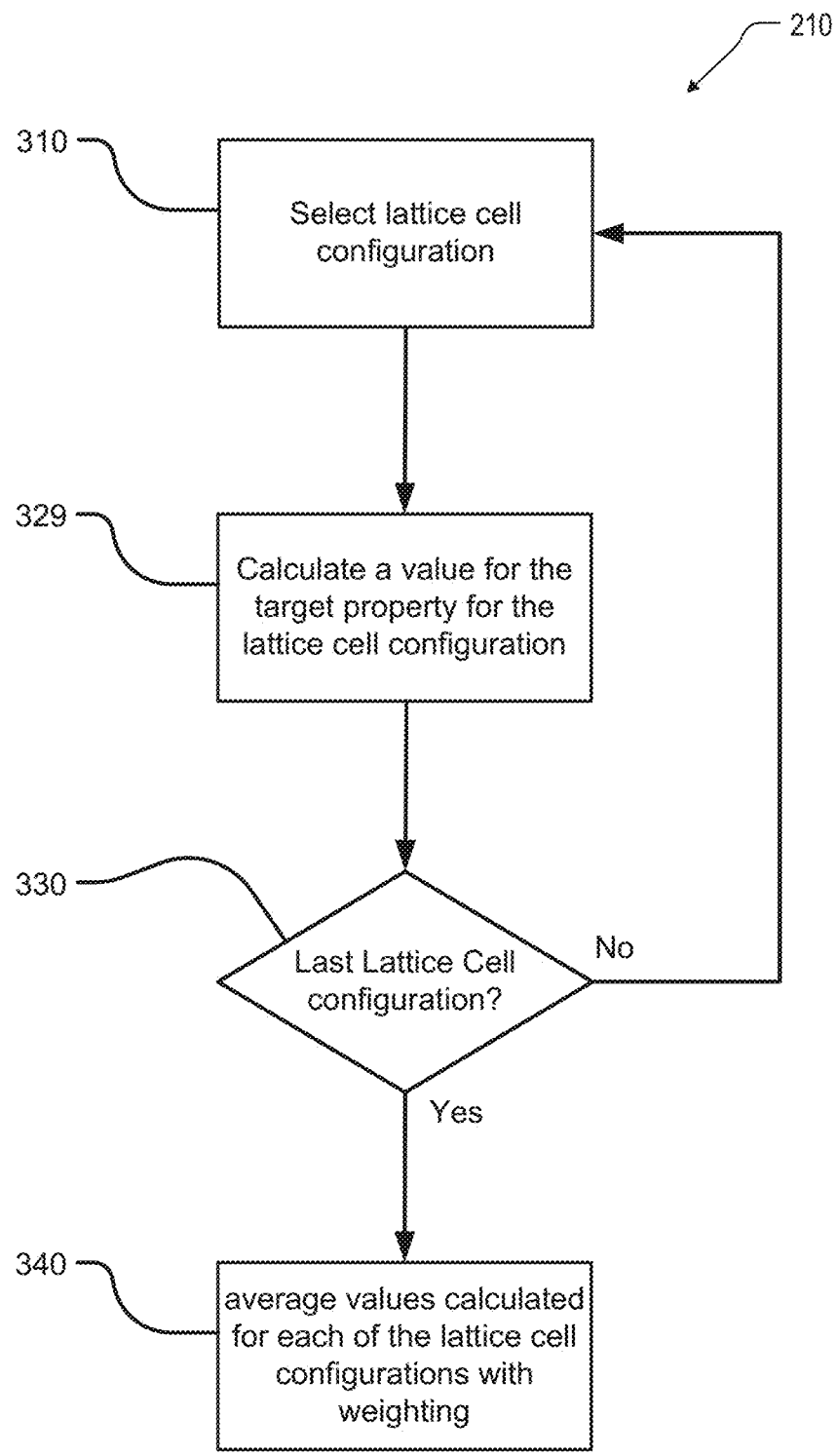
FIG. 3 is a flow chart illustrating the first principles analysis module as shown in FIG. 2.

FIG. 3 is a flow chart detail of an aspect of the first principles analysis module 210 which addresses this issue by determining the target property value for each different physical state of the anchor material, then calculating an average value for the target property weighted by the probability of each physical state. The flow chart is describes with respect to different lattice configurations, but it will be appreciated that it also applies to other types of physical states not distinguished by the index property.

At step 310, the analysis module selects a lattice cell configuration. At step 320, the analysis module calculates a value for the target property for the lattice cell configuration. At step 330, it is determined whether the last lattice cell configuration has been processed. If not, the analysis module selects a next lattice cell configuration (310), and calculates a value for the target property for the next lattice cell configuration (320). If it is determined that the last lattice cell configuration has been processed (330, Yes), the analysis module then averages the values calculated for each of the lattice cell configurations, weighted by their relative probabilities of occurrence, and provides the average as the value for the target property of the material (340).

As inputs to the first principles analysis module, anchor materials descriptions include material composition, such as SiGe composition. Preferably, the anchor materials descriptions include several variations, one for each of several possible lattice configurations or other physical states that the material can assume, and their relative probabilities of occurrence. The probabilities of the various lattice configurations can be determined based on expert knowledge or theoretical considerations, or in some embodiments can be obtained from pre-existing reference material. Various lattice configurations are illustrated in FIGS. 4A, 4B, 4C and 4D.

The anchor materials descriptions can further include, for example, the size of a lattice cell to be analyzed. As used herein, a lattice cell can be a primitive cell, which is the smallest possible repeating structure from which a crystal can be constructed. For example, the primitive cell of GaAs is the 2-atom zincblende structure. A lattice cell can be a conventional cell, which may be larger than the primitive cell. For example, the conventional cell of GaAs is an 8-atom cubic cell composed of 4 primitive cells. A lattice cell can also be a supercell, which may be composed of multiple primitive cells or conventional cells. For example, a supercell of GaAs can be composed of 4 conventional cells or 16 primitive cells or 32 atoms. The size of a lattice cell increases as a larger supercell is used. The size of a lattice cell can be determined, by EDA tools such as the Synopsys tool "Sentaurus Process", for subsequent calculations by the first principles analysis module (e.g. 210).

The anchor materials descriptions can also include, for example, identities of the particle types in the cell, the relative positions of the particles within the cell, and the pseudopotential data or the projector augmented wave (PAW) data for each different particle type, which may be obtained theoretically or from a repository of pre-computed pseudopotential or PAW data. Note that as used herein, the term "particle type" also includes vacancies, holes and defects in a crystal lattice structure.

More information about the materials descriptions to be provided to the first principles analysis module, as an example, can be found in the document *VASP the Guide*, by Georg Kresse, et al., Computational Physics, Faculty of Physics, Universität Wien, Sensengasse 8, A-1130 Wien, Austria, incorporated by reference herein.

FIGS. 4A, 4B, 4C and 4D illustrate examples of various lattice configurations, including point defects such as vacancy defects, interstitial defects and substitutional defects, using a GaAs alloy as an example. A conventional 8-atom cell (e.g. 400), and a supercell composed of 4 conventional cells are shown in each of the figures. As used herein, a host is the material into which native defects and dopants diffuse, and a host atom is an atom in the host material without any diffusion into the host material. The host material can be an alloy.

Figure 4A:
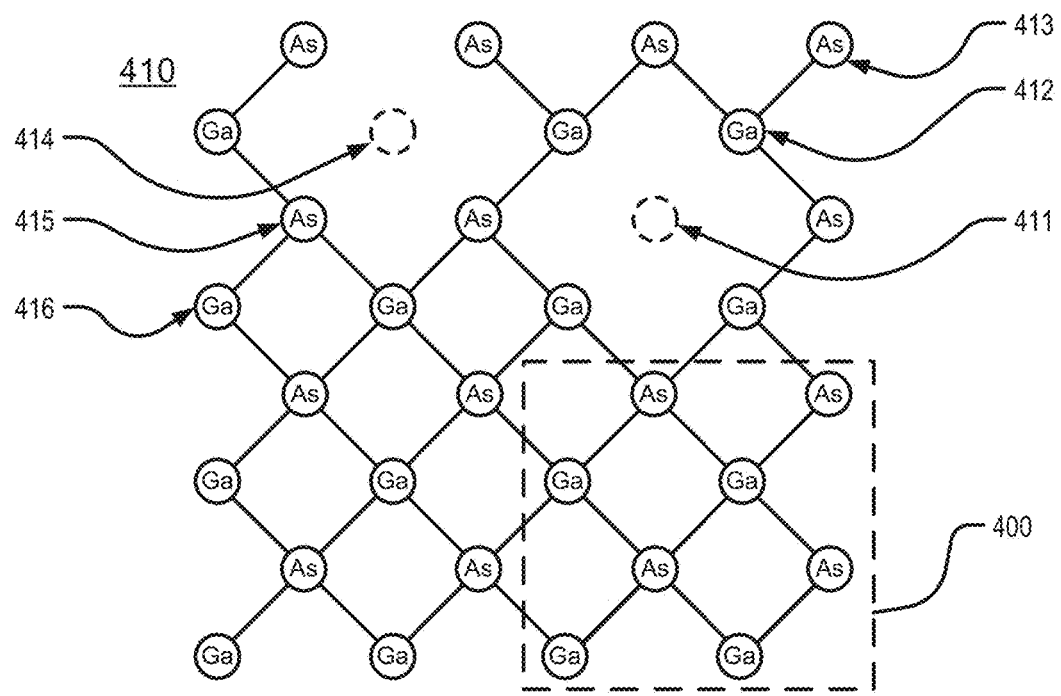
FIGS. 4A, 4B, 4C and 4D illustrate various lattice configurations.

FIG. 4A illustrates a supercell 410 including host atoms Ga (Gallium) and As (Arsenic), and lattice vacancy defects (e.g. 411, 414) surrounded by adjacent host atoms Ga and As. A lattice vacancy defect refers to an atom site in a crystal lattice where a single host atom is missing. Neighbors of a point defect can be important. As shown in the example of FIG. 4A, a vacancy defect has first order neighbors and second order neighbors. For instance, vacancy defect 411 at an As site has 4 first-order neighbors that are Ga atoms (e.g. 412), and more second-order neighbors (e.g. 413). Vacancy defect 414 at a Ga site has 4 first-order neighbors that are As atoms (e.g. 415), and more second-order neighbors (e.g. 416).

In a different alloy there can be more options for first-order neighbors. For instance in a SiGe alloy (not shown), a point defect such as a vacancy defect can have different first-order neighbors including 4 Si atoms, 3 Si atoms and 1 Ge atom, 2 Si atoms and 2 Ge atoms, 1 Si and 3 Ge atoms, or 4 Ge atoms.

Figure 4B:
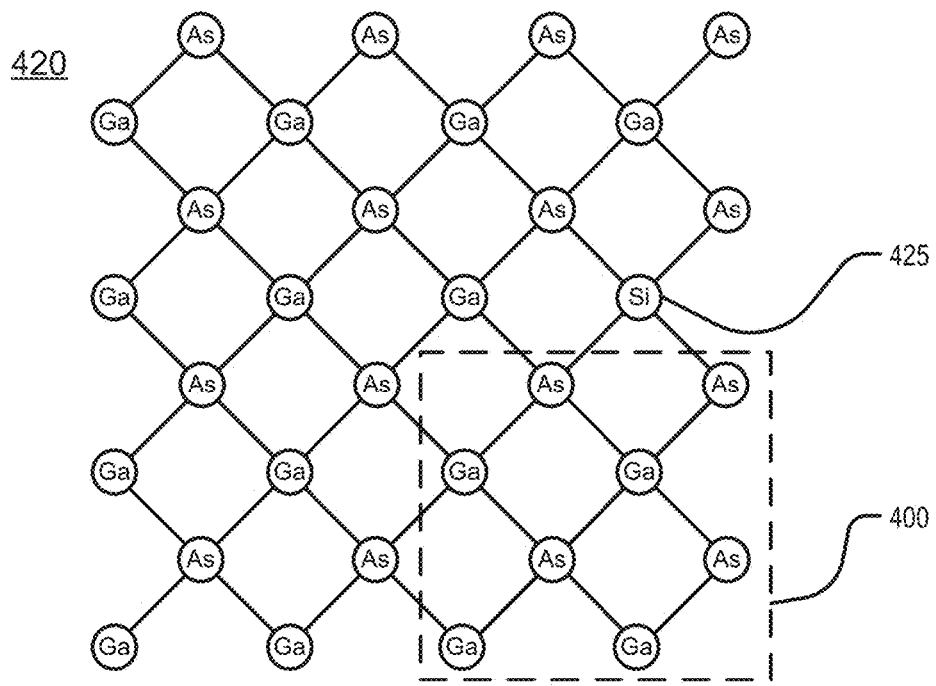

FIG. 4B illustrates an example of a dopant atom surrounded by various different numbers of host atoms adjacent thereto. Impurities or dopants can be doped into the GaAs host material. Group IV elements such as Si (silicon) can act as either donors on Ga sites or acceptors on As sites. In the example of FIG. 4B, Si is used as the dopant (e.g. 425).

Figure 4C:
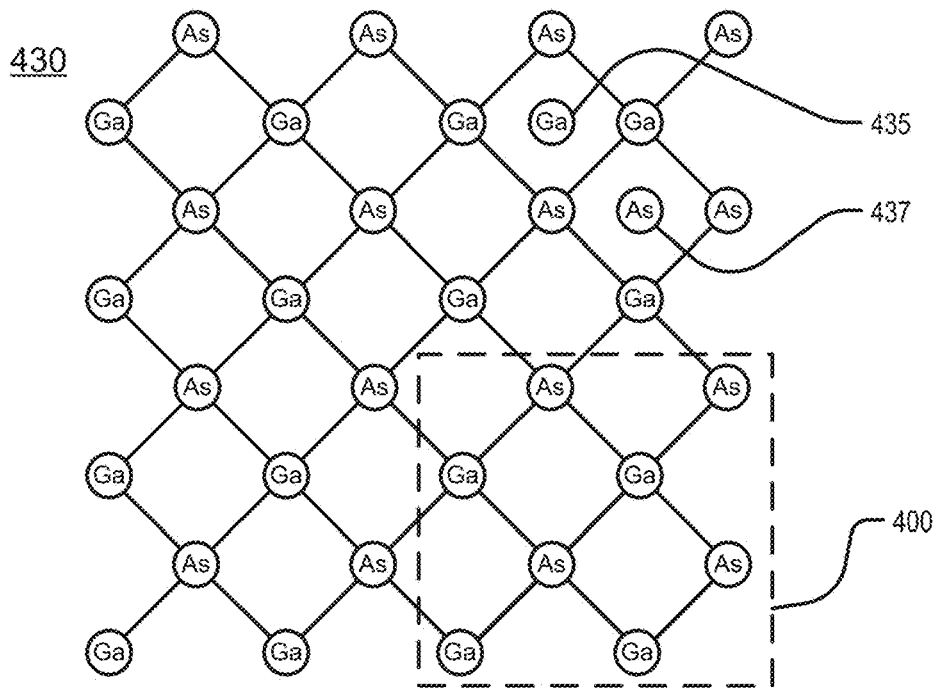

FIG. 4C illustrates an example of an interstitial defect atom surrounded by various different numbers of host atoms adjacent thereto, where an interstitial defect atom is present in the interstitial spaces between the host crystal lattice sites. In an alloy (e.g. GaAs), each alloying species (e.g. Ga, As) can be at a defect site between lattice sites or an interstitial location off the crystal lattice. In the example of FIG. 4C, a Ga interstitial is at a defect site (e.g. 435), while an As interstitial is at another defect site (e.g. 437). In a tetrahedrally coordinated GaAs configuration (not shown), a Ga interstitial or a As interstitial can have four equidistant first-order neighbors. In a hexagonally coordinated GaAs configuration (not shown), a Ga interstitial or a As interstitial can have six equidistant first-order neighbors, including 3 Ga atoms and 3 As atoms.

Figure 4D:
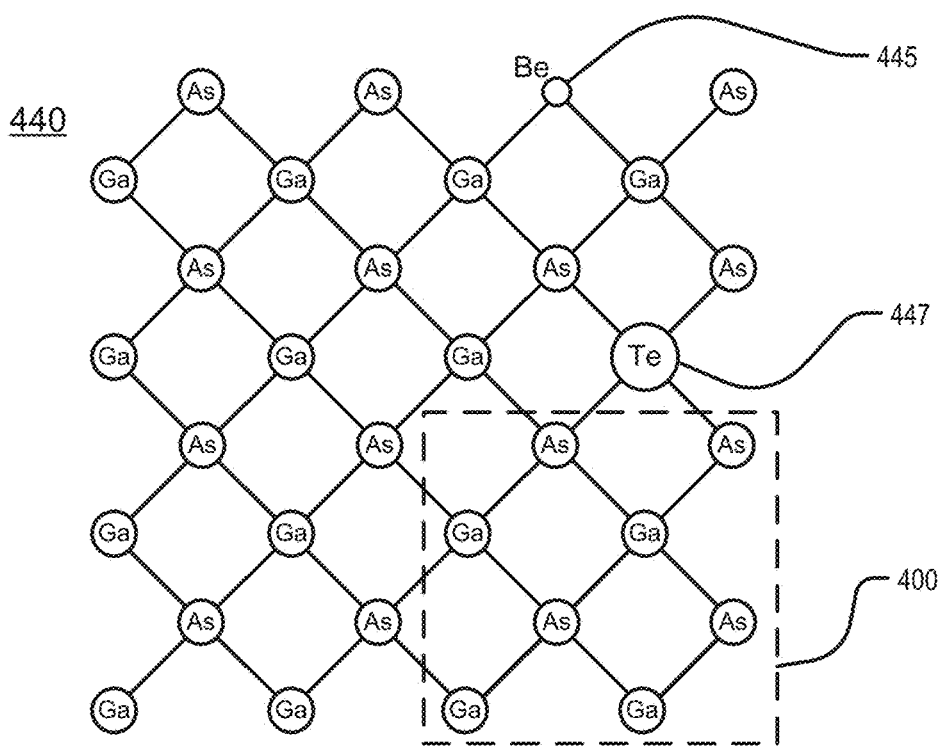

FIG. 4D illustrates an example of a substitutional defect atom surrounded by various different numbers of host atoms adjacent thereto, where a host atom is replaced by an atom of a different type than the host atoms. A substitutional defect atom can be smaller or larger than a host atom (covalent radius of Ga=126 pm, covalent radius of As=119 pm). In the example of FIG. 4D, Be (Beryllium, covalent radius=90 pm) is shown as a smaller substitutional defect atom at a defect site (e.g. 445), while Te (Tellurium, covalent radius=135 pm) is shown as a larger substitutional defect atom at another defect site (e.g. 447).

For a more complex material, there can be more types of point defects. For instance, indium gallium arsenide (InGaAs) is a ternary alloy of indium, gallium and arsenic. Indium and gallium are both from the boron group (group III) of elements, and thus have similar roles in chemical bonding. InGaAs is regarded as an alloy of gallium arsenide and indium arsenide with properties intermediate between the two depending on the proportion of gallium to indium. For instance, compounds In0.75 Ga0.25As, In0.5 Ga0.5As, and In0.25 Ga0.75 include different proportions of gallium to indium, while InAs does not include Ga and GaAs does include In.

In InGaAs, point defects can include As vacancy (i.e. missing lattice atom where As is supposed to be), In/Ga vacancy (i.e. missing lattice atom where In or Ga is supposed to be), As interstitial (i.e. extra As atom between lattice sites), In interstitial (i.e. extra In atom between lattice sites), Ga interstitial (i.e. extra Ga atom between lattice sites), As atom in the In/Ga lattice site, In atom in the As lattice site, and Ga atom in the As lattice site. For each of these point defects, there are different combinations of first-order neighbors, similar to the first-order neighbors described for the SiGe alloy.

All these variations and others represent different physical states of an anchor material, which can be addressed in FIG. 3.

Anchor materials descriptions can include proportions of gallium to indium in different InGaAs compounds, and configurations including various point defects in InGaAs compounds. Using the anchor materials descriptions, the methodology described herein can find target properties for a target material, such as In0.21Ga0.79As and In0.22Ga0.78As.

Figure 5:
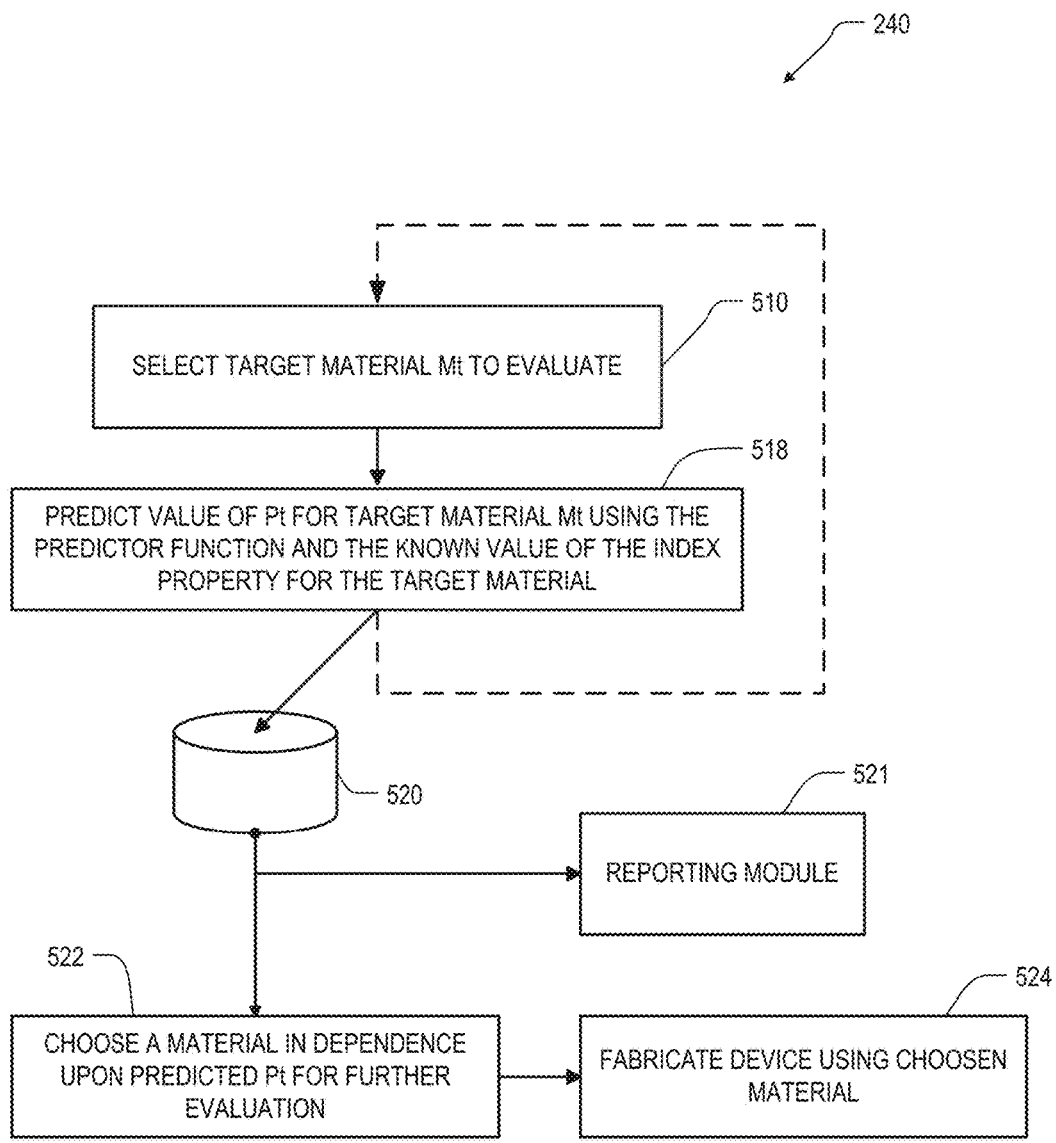
FIG. 5 is a flow chart illustrating the target property value prediction module as shown in FIG. 2.

FIG. 5 is a flow chart detail of the target property value prediction module 240 as shown in FIG. 2. In module 510 a target material Mt is selected for evaluation. In an example, the target material may be $Si_{(1-x)}Ge_x$, where x=0.7. In module 518, now that the predictor function is known from the predictor function determination module (216, FIG. 2), the value of the target property Pt for the target material Mt is predicted by evaluating the predictor function using the known value of the index property for the target material Mt. In the Boron diffusivity example, the predictor function is evaluated at x=0.7 in order to calculate a predicted value for the target property, Boron diffusivity. Note that the predictor function is not a straight line. Note also that the evaluation of the predictor function might in some embodiments be an extrapolation rather than an interpolation.

After the value of the target property has been predicted for the target material, it can be written into a database 520. Optionally, depending on the user's needs, the methodology can then include returning to module 510 to evaluate another target material. The database 520 can be stored on a hard drive or in a memory location or in one or more non-transitory computer readable media as that term is defined elsewhere herein.

A reporting module 521 can report output including the predicted value to a user. In one embodiment the output is written to a non-transitory computer readable medium such as a disk drive or computer memory, and in a further embodiment the output can be provided to a visualization module which presents the predicted value for one or more target materials in a visual form which simplifies user interpretation of the results.

In module 522, one or more materials are chosen in dependence upon their predicted values for the target parameter and further evaluation of the materials can be performed. Eventually a device is fabricated using one of the chosen materials (module 524). In various embodiments, results including one or more materials chosen substantially as described herein can be used for a variety of real world aspects of building or improving integrated circuit devices. In one embodiment, for example, the results are used to develop or improve a fabrication process flow that can be used to manufacture designs. In another embodiment the results are used to characterize or improve transistors and other devices. In other embodiments the results are used to develop HSPICE models of integrated circuit devices, in order to enable designers to develop better circuit designs and layouts. In yet other embodiments the results are used to improve process flow to achieve the desired transistor performance. Thus the numerical values obtained by the methods and systems described herein are used for real world technological development or implementation of semiconductor manufacturing processes or circuit designs.

The methodology illustrated with FIGS. 2, 3 and 5 can be implemented in a variety of different kinds of analysis tools. The analysis tools accept their inputs in the form of an input a file or files or other data stream, specified to the tool through a GUI, a command line interface, or by a script or program. In one embodiment, the tool takes as input an identification of one or more target materials to evaluate, and one or more target properties, and operates modules 210 and 216 in FIG. 2 to determine the predictor function, and modules 510 and 518 in FIG. 5, looking up any needed information in a pre-existing database or requesting it as needed from a user. In another embodiment, the tool takes as input the predictor function and the index property value for the target material, and operates only module 518. In yet another embodiment, the tool takes as input the predictor function and the index property value for a variety of target materials to be evaluated, and operates module 518 multiple times to predict values for the target property for each of the target materials. The latter embodiment might be useful, for example, if the user desires to determine the optimum composition of an alloy of two or more pre-selected materials. Many other types of analysis tools will be apparent to the reader.

The logic of FIG. 5, as well as the logic of other flow charts herein, can be implemented using processors programmed using computer programs stored in memory accessible to the computer systems and executable by the processors, by dedicated logic hardware, including field programmable integrated circuits, or by combinations of dedicated logic hardware and computer programs. Each block in the flowchart describes logic that can be implemented in hardware or in software running on one or more computing processes executing on one or more computer systems. In one embodiment, each step of the flow chart illustrates the function of a separate module of software. In another embodiment, the logic of the step is performed by software code routines which are distributed throughout more than one module. As with all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that in a specific embodiment, numerous additional steps for accomplishing other functions for that embodiment can be performed before, after and between those steps shown.

Hardware for all Inventive Aspects

Figure 6:
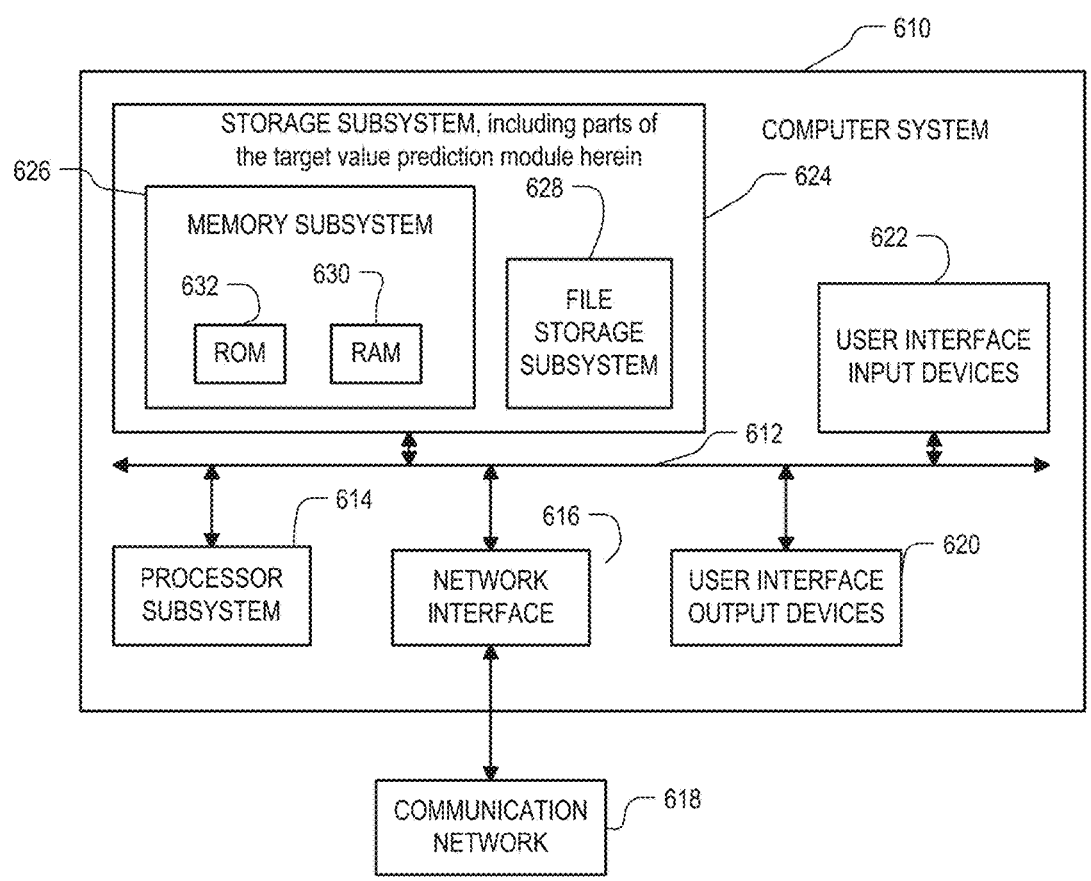
FIG. 6 is a simplified block diagram of a computer system that can be used to implement any of the methods and processes herein.

FIG. 6 is a simplified block diagram of a computer system 610 that can be used to implement any of the methods and processes herein. Particularly it can be used to implement modules 510, 512, 514, 516, 518 and/or 522 in various embodiments, as well as the analysis tool. It also includes or accesses the database 520. Aspects of module 524 can be performed using a computer system 610 as well.

Computer system 610 typically includes a processor subsystem 614 which communicates with a number of peripheral devices via bus subsystem 612. These peripheral devices may include a storage subsystem 624, comprising a memory subsystem 626 and a file storage subsystem 628, user interface input devices 622, user interface output devices 620, and a network interface subsystem 616. The input and output devices allow user interaction with computer system 610. Network interface subsystem 616 provides an interface to outside networks, including an interface to communication network 618, and is coupled via communication network 618 to corresponding interface devices in other computer systems. Communication network 618 may comprise many interconnected computer systems and communication links. These communication links may be wireline links, optical links, wireless links, or any other mechanisms for communication of information, but typically it is an IP-based communication network. While in one embodiment, communication network 618 is the Internet, in other embodiments, communication network 618 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 622 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 610 or onto computer network 618.

User interface output devices 620 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The display subsystem may also provide non visual display such as via audio output devices. In general, use of the term "output device" is intended to include all possible types of devices and ways to output information from computer system 610 to the user or to another machine or computer system. In one implementation, reporting by the reporting module 521 (FIG. 5) can be performed by way of the user interface output devices 620.

Storage subsystem 624 stores the basic programming and data constructs that provide the functionality of certain embodiments of the present invention. For example, the various modules implementing the functionality of certain embodiments of the invention may be stored in storage subsystem 624. These software modules are generally executed by processor subsystem 614. The databases 215 and 520 may reside in storage subsystem 624.

Memory subsystem 626 typically includes a number of memories including a main random access memory (RAM) 630 for storage of instructions and data during program execution and a read only memory (ROM) 632 in which fixed instructions are stored. File storage subsystem 628 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystem 628. The host memory 626 contains, among other things, computer instructions which, when executed by the processor subsystem 614, cause the computer system to operate or perform functions as described herein. As used herein, processes and software that are said to run in or on "the host" or "the computer", execute on the processor subsystem 614 in response to computer instructions and data in the host memory subsystem 626 including any other local or remote storage for such instructions and data.

Bus subsystem 612 provides a mechanism for letting the various components and subsystems of computer system 610 communicate with each other as intended. Although bus subsystem 612 is shown schematically as a single bus, alternative embodiments of the bus subsystem may use multiple busses.

Computer system 610 itself can be of varying types including a personal computer, a portable computer, a workstation, a computer terminal, a network computer, a television, a mainframe, a server farm, or any other data processing system or user device. Due to the ever changing nature of computers and networks, the description of computer system 610 depicted in FIG. 6 is intended only as a specific example for purposes of illustrating the preferred embodiments of the present invention. Many other configurations of computer system 610 are possible having more or less components than the computer system depicted in FIG. 6.

In addition, while the present invention has been described in the context of a fully functioning data processing system, those of ordinary skill in the art will appreciate that the processes herein are capable of being distributed in the form of a computer readable medium of instructions and data and that the invention applies equally regardless of the particular type of signal bearing media actually used to carry out the distribution. As used herein, a computer readable medium is one on which information can be stored and read by a computer system. Examples include a floppy disk, a hard disk drive, a RAM, a CD, a DVD, flash memory, a USB drive, and so on. The computer readable medium may store information in coded formats that are decoded for actual use in a particular data processing system. A single computer readable medium, as the term is used herein, may also include more than one physical item, such as a plurality of CD ROMs or a plurality of segments of RAM, or a combination of several different kinds of media. As used herein, the term does not include mere time varying signals in which the information is encoded in the way the signal varies over time.

Overall Design Process Flow

Figure 7:
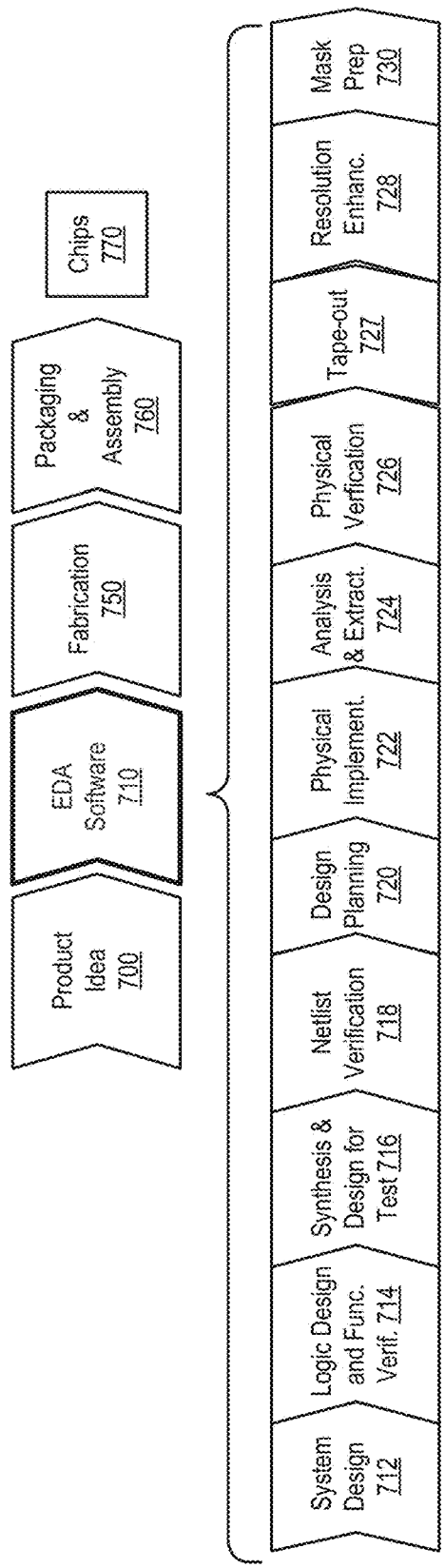
FIG. 7 shows a simplified representation of an illustrative digital integrated circuit design flow.

Aspects of the invention, including for example module 524, can include an integrated circuit design flow. FIG. 7 shows a simplified representation of an illustrative digital integrated circuit design flow, applicable for each of the chips 712 and 714 in the 3DIC. At a high level, the process starts with the product idea (step 700) and is realized in an EDA (Electronic Design Automation) software design process (step 710). When the design is finalized, it can be taped-out (step 727). At some point after tape out, the fabrication process (step 750) and packaging and assembly processes (step 760) occur resulting, ultimately, in finished integrated circuit chips (result 770).

The EDA software design process (step 710) is itself composed of a number of steps 712-730, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 710) will now be provided.

System design (step 712): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, System Studio, and DesignWare® products.

Logic design and functional verification (step 714): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products.

Synthesis and design for test (step 716): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and DesignWare® products.

Netlist verification (step 718): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 720): Here, an overall floor plan for the chip is constructed and analyzed for timing and top-level routing. Example EDA software products from Synopsys, Inc. that can be used at this step include Astro and Custom Designer products.

Physical implementation (step 722): The placement (positioning of circuit elements) and routing (connection of the same) occurs at this step, as can selection of library cells to perform specified logic functions. Example EDA software products from Synopsys, Inc. that can be used at this step include the Astro, IC Compiler, and Custom Designer products.

Analysis and extraction (step 724): At this step, the circuit function is verified at a transistor level, this in turn permits what-if refinement. Example EDA software products from Synopsys, Inc. that can be used at this step include Astro-Rail, PrimeRail, PrimeTime, and Star-RCXT products.

Physical verification (step 726): At this step various checking functions are performed to ensure correctness for: manufacturing, electrical issues, lithographic issues, and circuitry. Example EDA software products from Synopsys, Inc. that can be used at this step include the Hercules product.

Tape-out (step 727): This step provides the "tape out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 728): This step involves geometric manipulations of the layout to improve manufacturability of the design. Example EDA software products from Synopsys, Inc. that can be used at this step include Proteus, ProteusAF, and PSMGen products.

Mask data preparation (step 730): This step provides mask-making-ready "tape-out" data for production of masks for lithographic use to produce finished chips. Example EDA software products from Synopsys, Inc. that can be used at this step include the CATS(R) family of products. The method for actually making the masks can use any mask making technique, either known today or developed in the future. As an example, masks can be printed using techniques set forth in U.S. Pat. Nos. 6,096,458; 6,057,063; 5,246,800; 5,472,814; and 5,702,847, all incorporated by referenced herein for their teachings of mask printing techniques.

Parallel Flow.

Step 524 can also include a parallel flow, as follows:

(1) Develop individual process steps for manufacturing the integrated circuit. This can be modeled with EDA tools such as the Synopsys tools "Sentaurus Process", "Sentaurus Topography", and "Sentaurus Lithography". The input information here is the process conditions like temperature, reactor ambient, implant energy, etc. The output information is the change in geometry or doping profiles or stress distribution.

(2) Integrate the individual process steps into the complete process flow. This can be modeled with EDA tools such as the Synopsys tool "Sentaurus Process". The input information here is the collection of the process steps in the appropriate sequence. The output is the geometry, the doping profiles, and the stress distribution for the transistors and the space in between the transistors.

(3) Analyze performance of the transistor manufactured with this process flow. This can be done with EDA tools such as the Synopsys tool "Sentaurus Device". The input information here is the output of step (3) and the biases applied to transistor terminals. The output information is the currents and capacitances for each bias combination.

(4) If necessary, modify the process steps and the process flow to achieve the desired transistor performance. This can be done iteratively by using tools such as the Synopsys tools mentioned above.

Once the process flow is ready, it can be used for manufacturing multiple circuit designs coming from different fabless companies. The EDA flow 712-730 will be used by such fabless companies. The parallel flow described here is used at a foundry to develop a process flow that can be used to manufacture designs coming from their fabless customers. A combination of the process flow and the masks 730 are used to manufacture any particular circuit. If the integrated circuit is manufactured at an IDM (integrated device manufacturer) company instead of the combination of a fables company and a foundry, then both parallel flows described above are done at the same IDM company.

The following documents provide additional information about terms and components as used in the present specification, and are incorporated by reference herein:

S. Sant et al., J. Appl. Phys., v. 113, pp. 033708-1 through 033708-10 (2013)

R. Braunstein, A. R. Moore, and F. Herman, "Intrinsic Optical Absorption in Germanium-Silicon Alloys," Physical Review, vol. 109, no. 3, pp. 695-710, 1958.

S. Uppal, et. al., J. Appl. Phys., v. 96, No. 3, pp. 1376-1380 (2004)

Y. M. Haddaraa, et. al., Appl. Phys. Letters, v. 77, No. 13, pp. 1976-1978 (2000)

S. Uppal, et. al., J. Appl. Phys., v. 90, No. 8, pp. 4293-4295 (2001)

SOME PARTICULAR EMBODIMENTS

One embodiment of the technology disclosed is a method for approximating a target property of a target material. For each material in a plurality of anchor materials, a correspondence is provided between the value for a predetermined index property of the material and a value for the target property of the material, where the values of all the index properties are different. A predictor function is identified in dependence upon the correspondence. A computer system determines a value for the target property for the target material in dependence upon the predictor function and a value for the index property for the target material. The determined value for the target property for the target material is reported to a user. Additional embodiments of the technology disclosed include corresponding systems, and non-transitory computer readable media.

These and additional embodiments can include one or more of the following features. In another embodiment, the method can include providing the correspondence in a database on a non-transitory computer readable medium, and/or determining the correspondence experimentally for each material in a plurality of anchor materials.

In yet another embodiment, for a given one of the anchor materials, a description of the given anchor material can be provided to an analysis module, and the analysis module can be executed to determine the value for the target property of given material, in dependence upon the description. A lattice cell description for the given anchor material can be identified to the analysis module, and furthermore, descriptions of a plurality of lattice cell configurations that the given anchor material can assume can be identified to the analysis module, where each of the lattice cell configurations is in association with its relative probability of occurrence. The analysis module can calculate a value for the target property for each of the lattice cell configurations, and provide as the value for the target property of the material an average of the values calculated for each of the lattice cell configurations, weighted by their relative probabilities of occurrence. The analysis module can include a first principles analysis module, and/or a DFT analysis module.

In some embodiments, identifying a predictor function in dependence upon the correspondence can include identifying a form for the predictor function, where the form has a plurality of coefficients, and can include fitting the form of the predictor function to the values in the correspondence to determine values for the coefficients. In one embodiment, the form of the predictor function can be a polynomial. In one embodiment, identifying a form for the predictor function can include reference to expert knowledge.

In some other embodiments, to determine a value for the target property for the target material in dependence upon the predictor function and a value for the index property for the target material, the predictor function is evaluated using the value for the index property for the target material.

As mentioned above, the technology disclosed may be implemented in a system for approximating a target property of a target material. The system includes one or more processor configured to perform operations implementing methods as described herein and any of the features and optional embodiments of the methods described.

As mentioned above, the technology disclosed may be implemented in non-transitory computer readable medium storing computer instructions for evaluating candidate materials for fabrication of integrated circuits. The non-transitory computer readable medium includes actions to implement methods as described herein and any of the features and optional embodiments of the methods described.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features.

In particular and without limitation, though many of the inventive aspects are described individually herein, it will be appreciated that many can be combined or used together with each other. All such combinations are intended to be included in the scope of this document.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated.

The invention claimed is:

1. A system for selecting candidate alloys in dependence upon their determined values for a target property relevant to building or improving integrated circuit devices,
the system comprising a memory and a data processor coupled to the memory, the data processor configured with:
a source of, for each alloy in a plurality of anchor alloys, a correspondence between a mole fraction of each element in the anchor alloy and a value for the target property of the anchor alloy, the mole fractions for all the anchor alloys being different;
a target value prediction module which is configured to:
provide a predictor function form for the target property in dependence upon physics principles of the target property in alloys, the predictor function form having a set of at least one coefficient,
determine the coefficients in dependence upon the correspondences between the mole fraction of each element in the anchor alloys and the value for the target property of the anchor alloy, and
determine a value for the target property for each of a plurality of candidate alloys in dependence upon the mole fraction of each element in the candidate alloy and in further dependence upon the predictor function, each of the candidate alloys being different from the anchor alloys; and
a choosing module to choose one or more but fewer than all of the candidate alloys for further evaluation as an alloy for building or improving integrated circuit devices, based on their determined values for the target property.

2. The system of claim 1, wherein the source of the correspondence comprises a database on a non-transitory computer readable medium.

3. The system of claim 2, wherein correspondences were determined experimentally for each alloy in the plurality of anchor alloys.

4. The system of claim 1, wherein the source of correspondences comprises an analysis module of a computer system, the analysis module determining the value for the target property of a given anchor alloy in dependence upon a description of the given anchor alloy provided to the analysis module.

5. The system of claim 4, wherein the provided description of the given anchor alloy comprises a lattice cell description for the given anchor alloy.

6. The system of claim 4, wherein the provided description of the given anchor alloy comprises descriptions of a plurality of lattice cell configurations that the given anchor alloy can assume, each in association with its relative probability of occurrence.

7. The system of claim 6, wherein the analysis module:
calculates a value for the target property for each of the lattice cell configurations; and
provides as the value for the target property of the anchor alloy an average of the values calculated for each of the lattice cell configurations, weighted by their relative probabilities of occurrence.

8. The system of claim 4, wherein the analysis module comprises a first principles analysis module.

9. The system of claim 4, wherein the analysis module comprises a density functional theory analysis module.

10. The system of claim 1, wherein determining the coefficients of the predictor function comprises fitting the form of the predictor function to the values in the correspondences to determine values for the coefficients.

11. The system of claim 10, wherein the form of the predictor function is a polynomial.

12. A method for selecting candidate alloys in dependence upon their determined values for a target property relevant to building or improving integrated circuit devices, comprising:
for each alloy in a plurality of anchor alloys, a computer system providing a correspondence between a mole fraction of each element in the anchor alloy and a value for a target property of the anchor alloy, the mole fractions for all the anchor alloys being different;
a computer system providing a predictor function form for the target property in dependence upon physics principles of the target property in alloys, the predictor function form having a set of at least one coefficient;
a computer system determining the coefficients in dependence upon the correspondences between the mole fraction of each element in the anchor alloys and the value for the target property of the anchor alloy;
a computer system determining a value for the target property for each of a plurality of candidate alloys in dependence upon the mole fraction of each element in the candidate alloy and in further dependence upon the predictor function, each of the candidate alloys being different from the anchor alloys; and
choosing one or more but fewer than all the candidate alloys for further evaluation as an alloy for building or improving integrated circuit devices, based on their determined values for the target property.

13. The method of claim 12, wherein providing a correspondence comprises providing the correspondence in a database on a non-transitory computer readable medium.

14. The method of claim 12, wherein providing a correspondence comprises determining the correspondences experimentally for each alloy in a plurality of anchor alloys.

15. The method of claim 12, wherein providing a correspondence comprises, for a given one of the anchor alloys:
providing a description of the given anchor alloy to an analysis module of a computer system; and
executing the analysis module to determine the value for the target property of given alloy, in dependence upon the description.

16. The method of claim 15, wherein providing a description of the given anchor alloy comprises identifying to the analysis module a lattice cell description for the given anchor alloy.

17. The method of claim 15, wherein providing a description of the given anchor alloy comprises identifying to the analysis module descriptions of a plurality of lattice cell configurations that the given anchor alloy can assume, each in association with its relative probability of occurrence.

18. The method of claim 17, further comprising the analysis module:
calculating a value for the target property for each of the lattice cell configurations; and
providing as the value for the target property of the alloy an average of the values calculated for each of the lattice cell configurations, weighted by their relative probabilities of occurrence.

19. The method of claim 15, wherein the analysis module comprises a first principles analysis module.

20. The method of claim 15, wherein the analysis module comprises a density functional theory analysis module.

21. The method of claim 12, wherein determining the coefficients of the predictor function form comprises fitting the form of the predictor function to the values in the correspondences to determine values for the coefficients.

22. The method of claim 21, wherein the form of the predictor function is a polynomial.

23. The method of claim 12, wherein determining a value for the target property for a given one of the candidate alloys comprises evaluating the predictor function using the mole fraction of each element in the given candidate alloy.

24. A system for selecting candidate alloys in dependence upon their determined values for a target property relevant to building or improving integrated circuit devices,
the system comprising a memory and a data processor coupled to the memory, the data processor configured with:
a source of, for each alloy in a plurality of anchor alloys, a correspondence between a mole fraction of each element in the anchor alloy and a value for the target property of the anchor alloy, the mole fractions for all the anchor alloys being different;
a predictor function determination module which is configured to:
provide a predictor function form for the target property in dependence upon physics principles of the target property in alloys, the predictor function form having a set of at least one coefficient,
determine the coefficients in dependence upon the correspondences between the mole fraction of each element in the anchor alloys and the value for the target property of the anchor alloy;
a target value prediction module which is configured to determine a value for the target property for a specified candidate alloy in dependence upon the mole fraction of each element in the specified candidate alloy and in further dependence upon the predictor function; and
an analysis tool which controls the target value prediction module to perform a plurality of predictions, the analysis tool specifying to the target value prediction module, for each of the predictions, a respective candidate alloy from a plurality of candidate alloys, each of the candidate alloys in the plurality of candidate alloys being different from the anchor alloys.

25. The system of claim 24, wherein the source of the correspondence comprises a database on a non-transitory computer readable medium.

26. The system of claim 25, wherein correspondences were determined experimentally for each alloy in the plurality of anchor alloys.

27. The system of claim 24, wherein the source of correspondences comprises an analytic module of a computer system, the analytic module determining the value for the target property of a given anchor alloy in dependence upon a description of the given anchor alloy provided to the analytic module.

28. The system of claim 27, wherein the provided description of the given anchor alloy comprises a lattice cell description for the given anchor alloy.

29. The system of claim 27, wherein the provided description of the given anchor alloy comprises descriptions of a plurality of lattice cell configurations that the given anchor alloy can assume, each in association with its relative probability of occurrence.

30. The system of claim 29, wherein the analytic module:
calculates a value for the target property for each of the lattice cell configurations; and
provides as the value for the target property of the anchor alloy an average of the values calculated for each of the lattice cell configurations, weighted by their relative probabilities of occurrence.

31. The system of claim 27, wherein the analytic module comprises a first principles analysis module.

32. The system of claim 27, wherein the analytic module comprises a density functional theory analysis module.

33. The system of claim 24, wherein determining the coefficients of the predictor function comprises fitting the form of the predictor function to the values in the correspondences to determine values for the coefficients.

34. The system of claim 33, wherein the form of the predictor function is a polynomial.

* * * * *